(12) United States Patent
Kraus et al.

(10) Patent No.: US 7,514,373 B2
(45) Date of Patent: Apr. 7, 2009

(54) METHOD AND APPARATUS FOR PLASMA NITRIDATION OF GATE DIELECTRICS USING AMPLITUDE MODULATED RADIO-FREQUENCY ENERGY

(75) Inventors: Philip A. Kraus, San Jose, CA (US); Thai Cheng Chua, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 321 days.

(21) Appl. No.: 11/421,163

(22) Filed: May 31, 2006

(65) Prior Publication Data

US 2006/0216944 A1    Sep. 28, 2006

Related U.S. Application Data

(62) Division of application No. 10/819,392, filed on Apr. 6, 2004, now Pat. No. 7,179,754.

(60) Provisional application No. 60/474,125, filed on May 28, 2003.

(51) Int. Cl.
*H01L 21/469* (2006.01)
(52) U.S. Cl. .................. 438/775; 257/E21.143
(58) Field of Classification Search .......... 438/775; 257/E21.143
See application file for complete search history.

(56) References Cited

U.S. PATENT DOCUMENTS

| | | | |
|---|---|---|---|
| 6,041,734 A | 3/2000 | Raoux et al. | |
| 6,162,709 A | 12/2000 | Raoux et al. | |
| 6,610,615 B1 | 8/2003 | McFadden et al. | |
| 7,018,925 B2* | 3/2006 | Kirkpatrick et al. | 438/689 |
| 7,049,242 B2* | 5/2006 | Kirkpatrick et al. | 438/706 |
| 2003/0181012 A1 | 9/2003 | Wang et al. | |
| 2004/0124416 A1* | 7/2004 | Knipp et al. | 257/72 |
| 2004/0266113 A1* | 12/2004 | Kirkpatrick et al. | 438/275 |
| 2005/0205948 A1* | 9/2005 | Rotondaro et al. | 257/411 |
| 2005/0221564 A1* | 10/2005 | Bevan et al. | 438/287 |

OTHER PUBLICATIONS

PCT International Search Report and Written Opinion, dated Oct. 7, 2004 (AMAT/8467.PC).
Kraft, et al., "Surface Nitridation of Silicon Dioxide With a High Density Nitrogen Plasma," J. Vac. Sci. Technol. B 15(4), Jul./Aug. (1997), pp. 967-970.
Krug, et al., "Low Energy Nitrogen Implantation Into Si and $SiO_2$/Si," Nuclear Instruments and Methods in Physics Research b 175-177 (2001) pp. 694-698.
Park, et al., "Transient Characteristics of Nitrogen Gas-Pulsed Electron Cyclotron Resonance Plasma," j. Vac. Sci. Technol. A 14(5), Sep./Oct. (1996) pp. 2814-2819.
PCT Notification Concerning Transmittal of Copy of International Preliminary Report on Patentability dated Dec. 15, 2005 for International Application No. PCT/US04/016326). (APPM/008467PC).
PCT Written Opinion of the International Searching Authority dated Dec. 15, 2005 for International Application No. PCT/US04/016326). (APPM/008467PC).

* cited by examiner

*Primary Examiner*—Thao P. Le
(74) *Attorney, Agent, or Firm*—Patterson & Sheridan, LLP

(57) ABSTRACT

A method and apparatus for forming a nitrided gate dielectric layer. The method includes generating a nitrogen-containing plasma in a processing chamber via a smooth-varying modulated RF power source to reduce electron temperature spike. Field effect transistor channel mobility and gate leakage current results are improved when the power source is smooth-varying modulated, as compared to square-wave modulated.

33 Claims, 15 Drawing Sheets

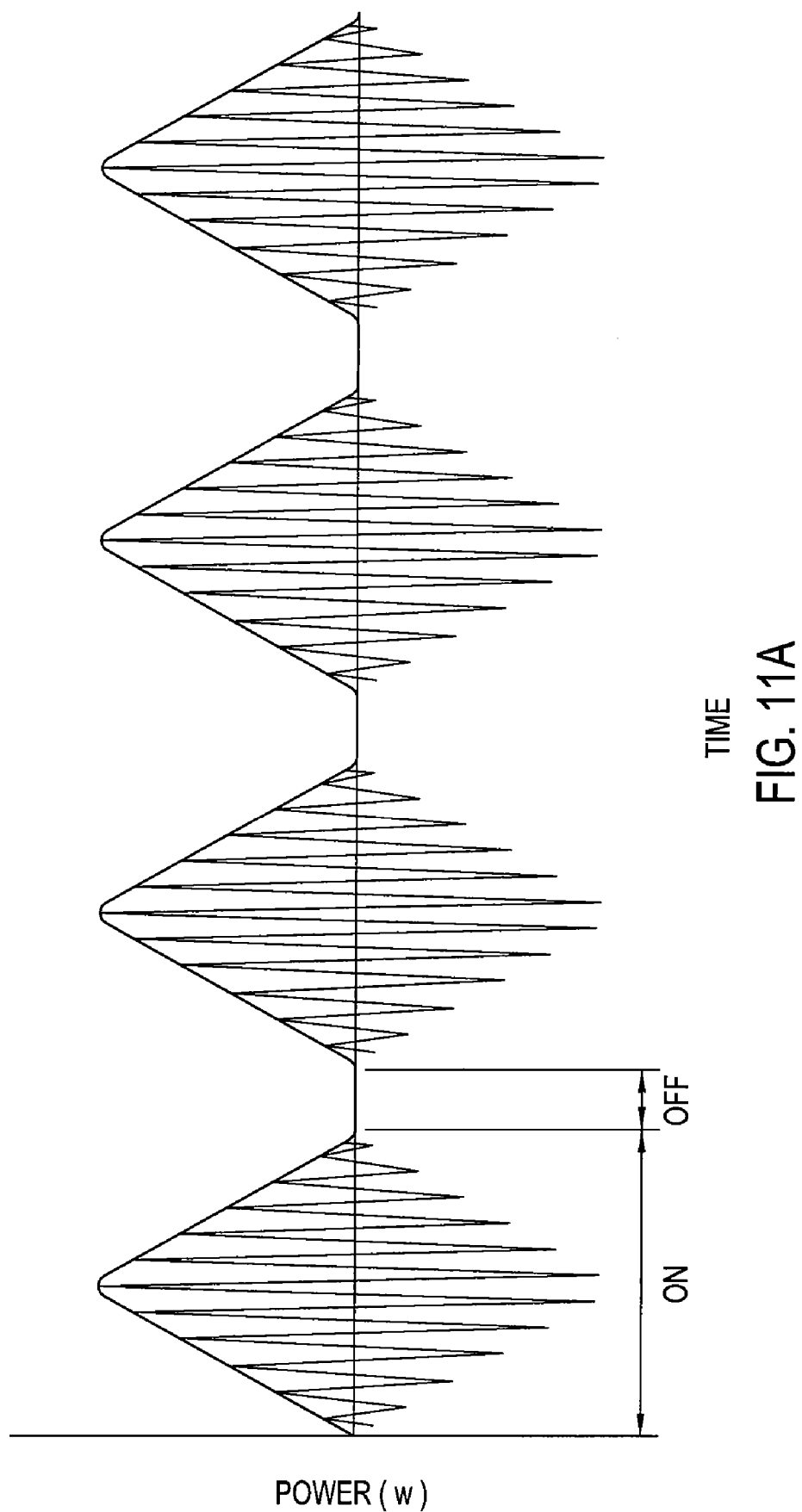

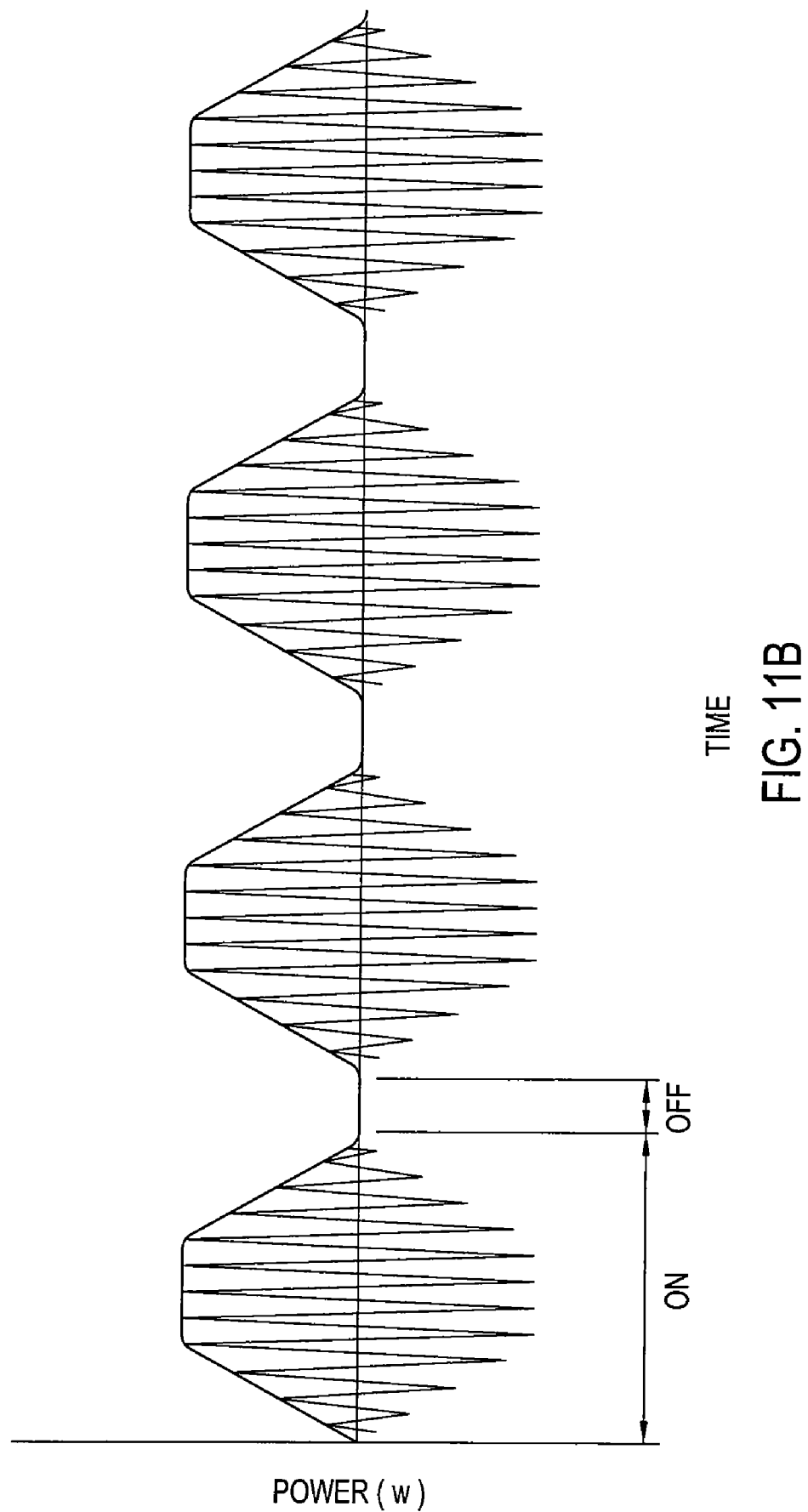

METHOD AND APPARATUS FOR PLASMA NITRIDATION OF GATE DIELECTRICS USING AMPLITUDE MODULATED RADIO-FREQUENCY ENERGY

CROSS-REFERENCE TO RELATED APPLICATIONS

This application is a divisional application of U.S. patent application Ser. No. 10/819,392, filed Apr. 6, 2004, now issued as U.S. Pat. No. 7,179,754; which claims benefit to U.S. Provisional Patent Application Ser. No. 60/474,125, filed May 28, 2003, both of which are incorporated by reference herein.

BACKGROUND OF THE INVENTION

1. Field of the Invention

Embodiments of the present invention generally relate to a method and an apparatus of forming a gate dielectric. More particularly, embodiments of the invention relate to a method of forming a nitrided gate dielectric layer.

2. Description of the Related Art

Integrated circuits are composed of many, e.g., millions, of devices such as transistors, capacitors, and resistors. Transistors, such as field effect transistors, typically include a source, a drain, and a gate stack. The gate stack typically includes a substrate, such as a silicon substrate, a gate dielectric, and a gate electrode, such as polycrystalline silicon, on the gate dielectric. The gate dielectric layer is formed of dielectric materials such as silicon dioxide ($SiO_2$), or a high-K dielectric material having a dielectric constant greater than 4.0, such as SiON, SiN, hafnium oxide ($HfO_2$), hafnium silicate (Hf-$SiO_2$), hafnium silicon oxynitride (HfSiON), zirconium oxide ($ZrO_2$), Zirconium silicate ($ZrSiO_2$), barium strontium titanate ($BaSrTiO_3$, or BST), lead zirconate titanate (Pb(ZrTi)$O_3$, or PZT), and the like. It should be noted, however, that the film stack may comprise layers formed of other materials.

FIG. 1 shows a cross section of FET (field effect transistor) 100 incorporating a gate dielectric layer 104. The figure shows a substrate 102 on which a gate dielectric 104 is disposed a gate electrode 106 overlies gate dielectric 104. Side wall spacers 108 are shown adjacent to the vertical sidewalls of gate dielectric 104 and gate electrode 106. Source/drain junctions 110 are formed in substrate 102 substantially adjacent the opposing vertical sidewalls of gate electrode 106.

As integrated circuit sizes and the sizes of the transistors thereon decrease, the gate drive current required to increase the speed of the transistor has increased. The drive current increases as the gate capacitance increases, and capacitance=kA/d, wherein k is the dielectric constant of the gate, d is the dielectric thickness, and A is the area of the device. Decreasing the dielectric thickness and increasing the dielectric constant of the gate dielectric are methods of increasing the gate capacitance and the drive current.

Attempts have been made to reduce the thickness of $SiO_2$ gate dielectrics below 20 Å. However, it has been found that the use of $SiO_2$ gate dielectrics below 20 Å often results in undesirable effects on gate performance and durability. For example, boron from a boron doped gate electrode can penetrate through a thin $SiO_2$ gate dielectric into the underlying silicon substrate. Also, there is typically an increase in gate leakage current, i.e., tunneling current, with thin dielectrics that increases the amount of power consumed by the gate. Thin $SiO_2$ gate dielectrics may be susceptible to NMOS hot carrier degradation, in which high energy carriers traveling across the dielectric can damage or destroy the channel. Thin $SiO_2$ gate dielectrics may also be susceptible to PMOS negative bias temperature instability (NBTI), wherein the threshold voltage or drive current drifts with operation of the gate.

A method of forming a dielectric layer suitable for use as the gate dielectric layer in a MOSFET (metal oxide semiconductor field effect transistor) includes nitridizing a thin silicon oxide film in a nitrogen-containing plasma. Increasing the net nitrogen content in the gate oxide to increase the dielectric constant is desirable for several reasons. For example, the bulk of the oxide dielectric may be lightly incorporated with nitrogen during the plasma nitridation process, which reduces the equivalent oxide thickness (EOT) over the starting oxide. This may result in a gate leakage reduction, due to tunneling during the operation of a FET, at the same EOT as the un-nitrided oxide dielectric. At the same time, such an increased nitrogen content may also reduce damage induced by Fowler-Nordheim (F-N) tunneling currents during subsequent processing operations, provided that the thickness of the dielectric is in the F-N range. Another benefit of increasing the net nitrogen content of the gate oxide is that the nitridized gate dielectric is more resistant to the problem of gate etch undercut, which in turn reduces defect states and current leakage at the gate edge.

In U.S. Pat. No. 6,610,615, titled "Plasma Nitridation For Reduced Leakage Gate Dielectric Layers" and issued on Aug. 26, 2003, McFadden et al. compares nitrogen profiles in a silicon oxide film for both thermal and plasma nitridation process (see FIG. 2). The nitrided oxide films are disposed on a silicon substrate. FIG. 2 further shows the nitrogen profiles in the crystalline silicon beneath the oxide film. The nitrogen profile data 202 for the thermally nitrided oxide shows a first concentration of nitrogen at a top surface of an oxide layer, a generally declining concentration of nitrogen deeper in the oxide, an interfacial accumulation of nitrogen at the oxide-silicon interface, and finally, a nitrogen concentration gradient that is generally declining with distance into the substrate. In contrast, it can be seen that the plasma nitridation process produces a nitrogen profile 204 that is essentially monotonically decreasing from the top surface of the oxide layer through the oxide-silicon interface and into the substrate. The undesirable interfacial accumulation of nitrogen seen with a thermal nitridation process does not occur with the ionic bombardment of the nitrogen plasma. Furthermore, the nitrogen concentration in the substrate is lower, at all depths, than is achieved with the thermal nitridation process.

As mentioned earlier, a benefit of increasing nitrogen concentration at the gate electrode-gate oxide interface is that dopant, such as boron, out-diffusion from polysilicon gate electrodes into or through the gate oxide is reduced. This improves device reliability by reducing defect states in the bulk of the gate oxide caused by, for example, in-diffused boron from a boron doped polysilicon gate electrode. Another benefit of reducing nitrogen content at the gate oxide-silicon channel interface is the reduction of fixed charge and interface state density. This improves channel mobility and transconductance. Therefore, plasma nitridation process has advantages over thermal nitridation process.

The plasma of the plasma nitridation process can be created by various ionizing power sources, which may, for example, include an inductively coupled power source, a capacitatively coupled power source, a surface wave power source, an electronic cyclotron resonance source (ECR source), magnetron or modified magnetron-type sources, or other ionizing sources that may be used to facilitate plasma generation in a processing chamber. A surface wave power source is a very high frequency (100 MHz to 10 GHz) plasma source, in which the gas collision frequency is much less than the electromagnetic wave frequency, such that the electromagnetic power is absorbed into the plasma by a "surface-wave" or "wave-heating" based energy transfer mechanism. Such a source would typically include a very high frequency power source, a wave guide connecting the power source to the chamber, a dielectric chamber wall and an arrangement of openings or slots adjacent to the dielectric wall in which the very high frequency power is coupled in to the chamber. Microwave ionization power source is a type of surface wave power source.

Independent of the type of power source, there can be significant capacitative coupling from the source to the plasma, which creates a relatively large plasma potential, on the order of tens of volts. Such a large plasma potential may cause excessive bombardment of the silicon dioxide layer by nitrogen ions, which can cause damage to the silicon dioxide layer. The large plasma potential may even result in incorporation of nitrogen into the underlying silicon, which diminishes the advantages of nitrogen incorporation in the gate oxide.

Therefore, there is a need in the art for a method and an apparatus for a plasma nitridation process that does not cause excessive damage of the silicon dioxide layer and silicon substrate with nitrogen ions.

SUMMARY OF THE INVENTION

The present invention generally relates to a method and an apparatus of plasma nitridation of a gate dielectric by a smooth-varying modulated power source to diminish the plasma electron temperature spike.

Embodiments of the invention provide a method of plasma nitridation of a gate dielectric that comprises placing a substrate comprising a gate dielectric film in a plasma chamber, and exposing the substrate to a nitrogen-containing plasma, ionized by a smooth-varying modulated power source, to form a nitrided gate dielectric on the substrate.

Embodiments of the invention further provide a method of plasma nitridation of a gate dielectric that comprises placing a substrate comprising a gate dielectric film in an inductively coupled plasma chamber, and exposing the substrate to a nitrogen-containing plasma, ionized by a smooth-varying modulated power source, to form a nitrided gate dielectric on the substrate, wherein the smooth-varying modulated power source varies a duty cycle of pulses between about 5% and about 90% at a frequency between about 1 kHz to about 100 kHz, and varies an ionizing power between about 0% and about 100% of the peak power, and a process gas for the nitrogen-containing plasma comprises at least one of nitrogen ($N_2$) and ammonia ($NH_3$) gases at a flow rate between about 50 sccm to about 20 slm.

Embodiments of the invention further provide a method of plasma nitridation of a gate dielectric that comprises placing a substrate comprising a gate dielectric film in a plasma chamber, and exposing the substrate to a nitrogen-containing plasma, ionized by a modulated power source that lacks discontinuities in the time-derivative of the magnitude of the power, to form a nitrided gate dielectric on the substrate.

Embodiments of the invention further provide a method of plasma nitridation of a gate dielectric that comprises placing a substrate comprising a gate dielectric film in a plasma chamber, and exposing the substrate to a nitrogen-containing plasma, ionized by a square-wave modulated RF waveform that is filtered by a resistor-capacitor to become a smooth-varying modulated RF waveform power source, to form a nitrided gate dielectric on the substrate.

Embodiments of the invention also provide an apparatus for plasma processing of a gate dielectric that comprises a plasma nitridation process chamber, and a power generator that can generate smooth-varying modulated power source.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 11A and 11B are examples of smooth-varying modulated RF power sources.

DETAILED DESCRIPTION OF THE PREFERRED EMBODIMENT

Embodiments of the invention include a method and an apparatus of plasma nitridation of a gate dielectric. Specifically, the present invention includes a method and an apparatus for diminishing the spike in electron temperature of nitridation plasma through the use of smooth-varying modulated (or pulsed) source power.

Figure 1:
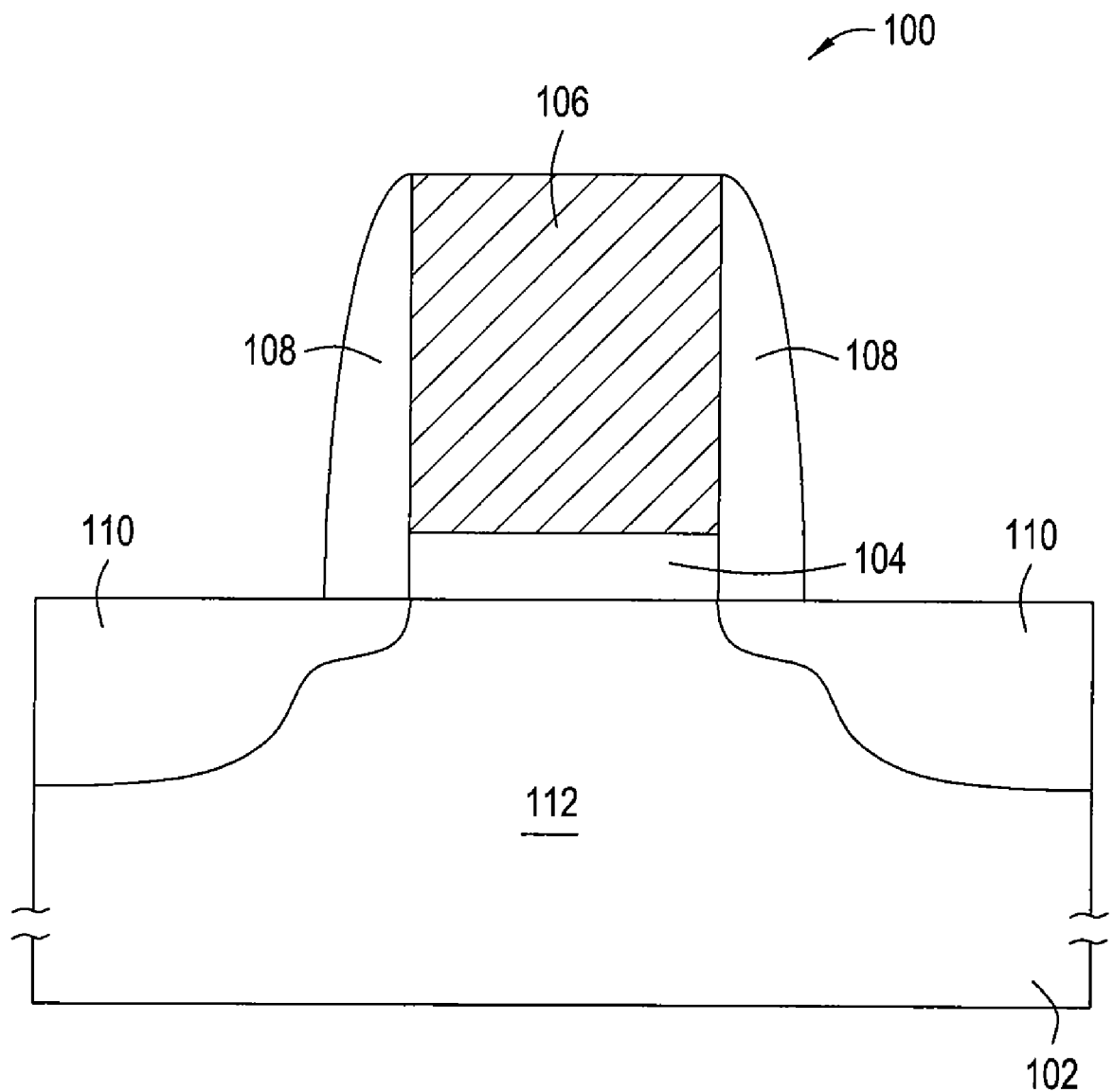
FIG. 1 (prior art) is a schematic cross-sectional view of FET and can be produced in accordance with the present invention.
Figure 2:
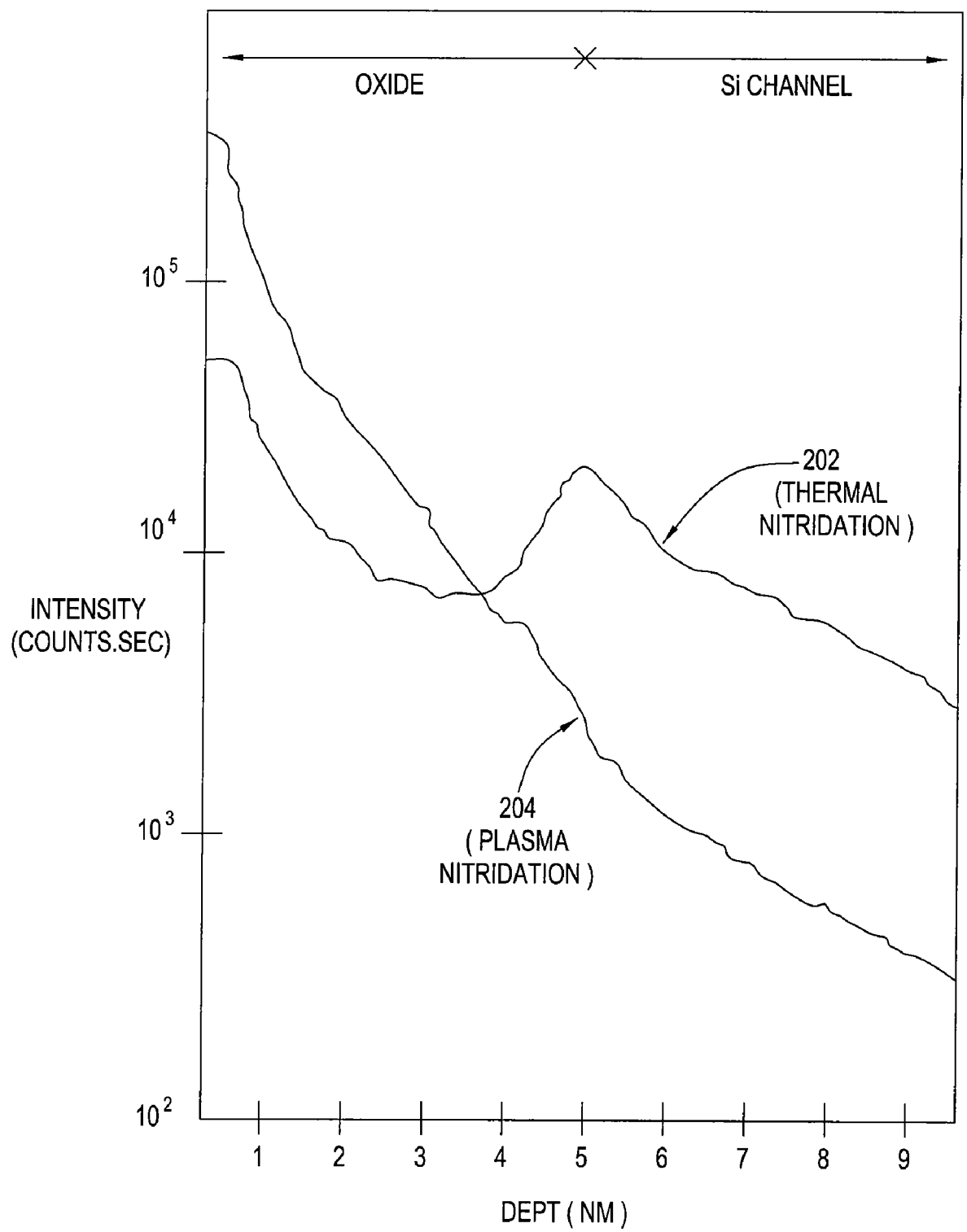
FIG. 2 (prior art) is a graph showing nitrogen concentration profiles, based on secondary ion mass spectroscopy data, for a conventional thermal nitridation process and for a plasma nitridation process.
Figure 3:
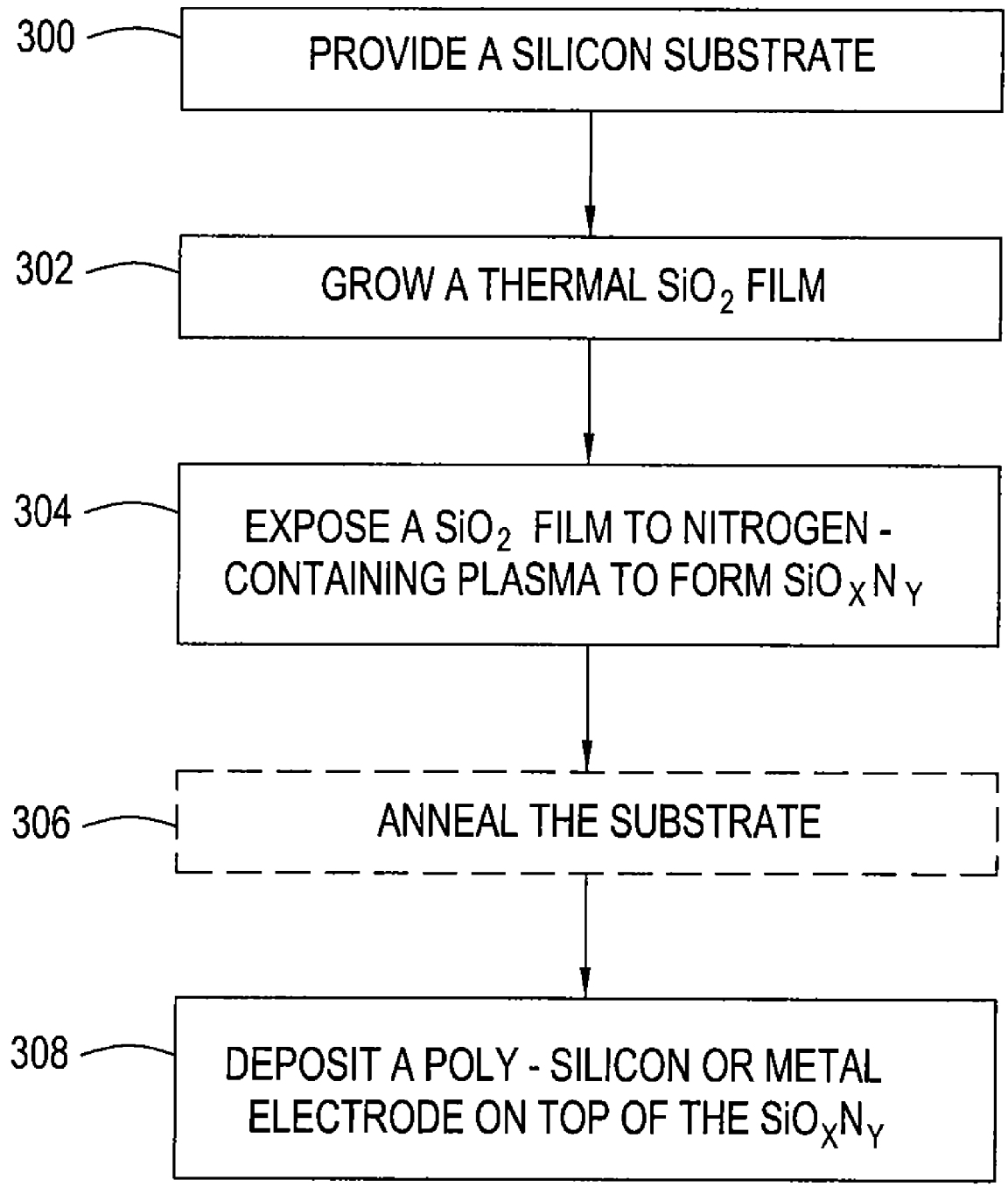
FIG. 3 is a process flow diagram in accordance with the present invention.

FIG. 3 shows an example of a process flow for plasma nitrided gate dielectrics formation. The process starts with providing a silicon substrate at step 300. First about 5 Å to about 40 Å of a thermal oxide film is grown on a Si wafer at step 302 in either a furnace or a rapid thermal processing chamber. Silicon dioxide ($SiO_2$) gate dielectric is described here as an example. The invention can be applied to other types of gate dielectric, which could be a high-K dielectric material having a dielectric constant greater than 4.0, such as SiON, SiN, hafnium oxide ($HfO_2$), hafnium silicate (Hf-$SiO_2$), hafnium silicon oxynitride (HfSiON), zirconium oxide ($ZrO_2$), Zirconium silicate ($ZrSiO_2$), barium strontium titanate ($BaSrTiO_3$, or BST), lead zirconate titanate (Pb(ZrTi)$O_3$, or PZT), and the like. Second, the substrate is transferred into a plasma chamber containing at least a nitrogen-containing gas for plasma nitridation at step 304. The plasma nitridation process continues for about 2 seconds to about 20 minutes to control the nitridation doze in $SiO_xN_y$ formation in step 304. Afterwards, the substrate could be transferred to a rapid thermal processing chamber for an optional post nitridation annealing of the $SiO_xN_y$ film at step 306. The post nitridation anneal could take place at a temperature from about 700-1100° C. in either inert or oxidizing ambient. Alternatively, the optional post nitridation anneal may comprise a two step process in which an inert or reducing step is followed by an oxidizing step. After forming the gate dielectric, a gate electrode, such as poly-silicon, is deposited by low pressure chemical vapor deposition (LPCVD) at step 308. The gate electrode can also be a metal layer.

Damage to the gate oxide and silicon channel from the impact of high energy ions during the plasma nitridation treatments could contribute to channel mobility reduction. The electron temperature (kTe) is an energy scale which describes the energy distribution of the free electrons in the plasma. Lower electron temperature means fewer high energy electrons and consequently fewer high energy nitrogen ions. Improved channel mobility for transistors with plasma nitrided $SiO_xN_y$ gate dielectric results when the nitrogen plasma has a lower electron temperature. Reducing electron temperature is possible by "modulating" (or pulsing) the ionizing source power, or turning the ionizing source power on and off at kHz frequencies.

In commonly assigned U.S. patent application Ser. No. 10/461,083, titled "Plasma Method and Apparatus for Processing a Substrate" and filed on Jun. 12, 2003, an invention of a nitrogen-containing plasma controlled via a plasma-modulating sequence to generate lower electron temperature than provided by conventional plasma processing has been described. The control over the plasma is configured to provide a lower electron temperature, which, for example, may be used in gate nitridation processes to improve device characteristics, i.e., to provide less degradation in transconductance, which reflects improved channel mobility, in gate dielectric-type devices.

U.S. patent application Ser. No. 10/461,083 describes a plasma modulating (or pulsing) sequence generally operating to energize the nitrogen-containing plasma for a short period of time, and then allowing the plasma to relax or dissipate for a period of time. The dissipation time period (or afterglow period) allows the electron temperature to decrease, while maintaining the nitrogen-containing plasma. During the off or relax portion of the ionizing source modulations, the electrons in the plasma diffuse freely. However, it is known that how fast the electrons diffuse is directly related to the electron energy. Therefore, the higher energy electrons, i.e., the hotter electrons, will diffuse more rapidly out of the plasma than electrons having lower energy, which results in a lower mean energy of the constituents of the plasma, i.e., a lower electron temperature and a lower-temperature plasma. It is also disclosed in the patent application that the duty cycle of the modulations (or pulses) provided by the ionized source also has an effect upon the mean temperature of the constituents of the plasma. Duty cycle is defined as the percentage of time that the RF power is on during each cycle. In particular, greater duty cycles, which correspond to longer modulation-on (or pulse-on) times, generate hotter plasmas, as the electrons in the plasma are being excited for a longer period of time during the modulation-on time.

Figure 4A:
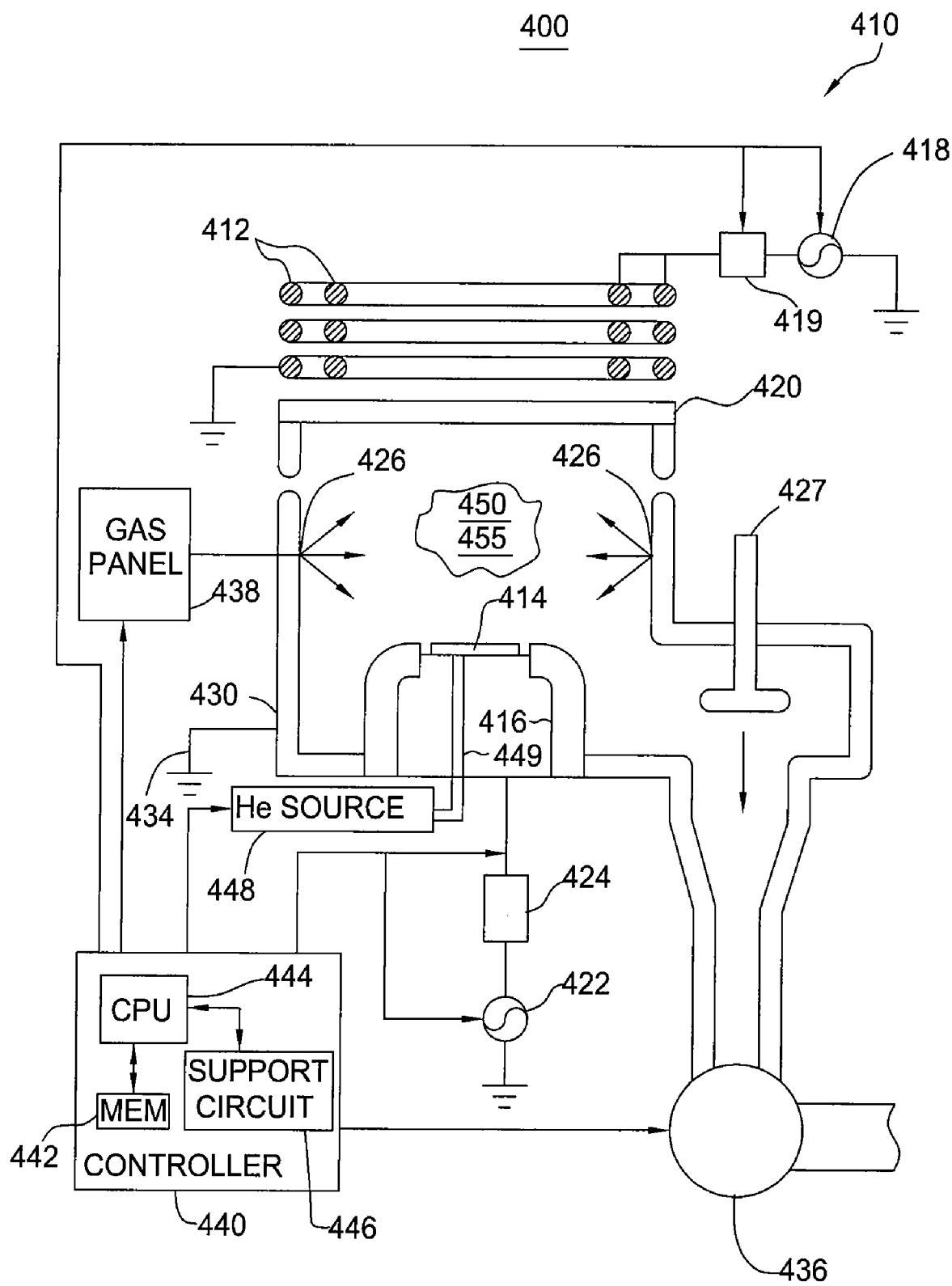
FIG. 4A shows a schematic diagram of a plasma reactor according to an embodiment of the invention.

FIG. 4A depicts a schematic, cross-sectional diagram of Decoupled Plasma Nitridation process reactor 400, made by Applied Materials located in Santa Clara, Calif. It is an inductive plasma source reactor that is an example of reactors that may be used to practice the present invention. The reactor 400 comprises a process chamber 410 having a wafer support pedestal 416 within a conductive body (wall) 430, and a controller 440. The chamber 410 is supplied with a substantially flat dielectric ceiling 420. Other modifications of the chamber 410 may have other types of ceilings, e.g., a dome-shaped ceiling. Above the ceiling 420 is disposed an antenna comprising at least one inductive coil element 412 (two co-axial elements 412 are shown). The inductive coil element 412 is coupled, through a first matching network 419, to a plasma power source 418. The plasma source 418 typically is capable of producing up to 3000 W at a tunable frequency in a range from 50 kHz to 13.56 MHz.

The support pedestal (cathode) 416 is coupled, through a second matching network 424, to a biasing power source 422. The biasing power source 422 is generally capable of producing a RF signal having a tunable frequency of 50 kHz to 13.56 MHz and a power of between 0 and 5000 Watts. However, it is disconnected during processing. Optionally, the biasing power source 422 may be a DC or pulsed DC source. A controller 440 comprises a central processing unit (CPU) 444, a memory 442, and support circuits 446 for the CPU 444 and facilitates control of the components of the chamber 410 and, as such, of the nitridation process, as discussed.

In operation, a semiconductor wafer 414 is placed on the pedestal 416 and process gases are supplied from a gas panel 438 through entry ports 426 to form a gaseous mixture 450. The gaseous mixture 450 is ignited into a plasma 455 in the chamber 410 by applying power from the plasma source 418. The pressure within the interior of the chamber 410 is controlled using a throttle valve 427 and a vacuum pump 436. Typically, the chamber wall 430 is coupled to an electrical ground 434. The temperature of the wall 430 is controlled using liquid-containing conduits (not shown) that run through the wall 430.

The temperature of the wafer 414 is controlled by stabilizing a temperature of the support pedestal 416. In one embodiment, helium gas from a gas source 448 is provided via a gas conduit 449 to channels (not shown) formed in the pedestal surface under the wafer 414. The helium gas is used to facilitate heat transfer between the pedestal 416 and the wafer 414. During processing, the pedestal 416 may be heated by a resistive heater (not shown) within the pedestal to a steady state temperature and then the helium gas facilitates uniform heating of the wafer 414. Using such thermal control, the wafer 414 is maintained at a temperature between about 20 to 350 degrees Celsius.

To facilitate control of the process chamber 410 as described above, the controller 440 may be one of any form of general-purpose computer processor that can be used in an industrial setting for controlling various chambers and sub-processors. The memory 442, or computer-readable medium, of the CPU 444 may be one or more of readily available memory such as random access memory (RAM), read only memory (ROM), floppy disk, hard disk, or any other form of digital storage, local or remote. The support circuits 346 are coupled to the CPU 444 for supporting the processor in a conventional manner. These circuits include cache, power supplies, clock circuits, input/output circuitry and sub-systems, and the like. The inventive method is generally stored in the memory 442 as a software routine. The software routine may also be stored and/or executed by a second CPU (not shown) that is remotely located from the hardware being controlled by the CPU 444.

Figure 4C:
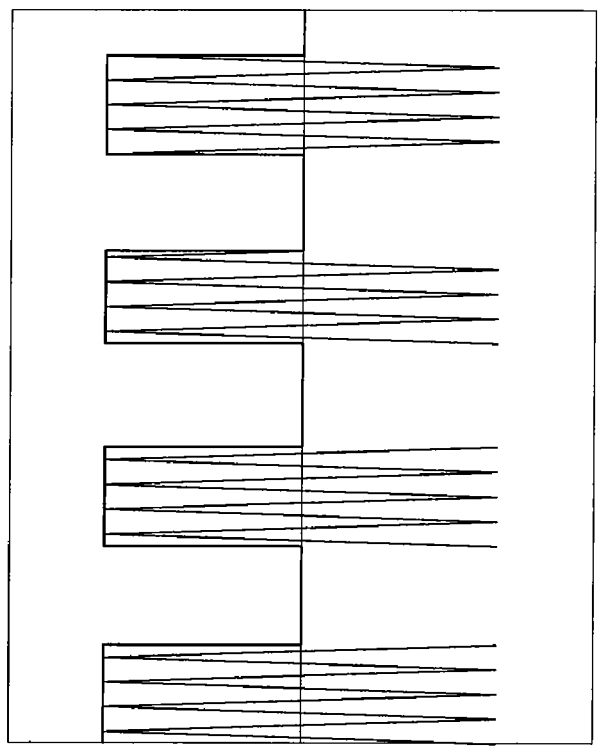
FIGS. 4B and 4C show un-modulated ionizing source power at radio frequency (4B) and square-wave modulated RF at kHz frequency (4C). In these schematics, the frequencies are not to scale.
Figure 4B:
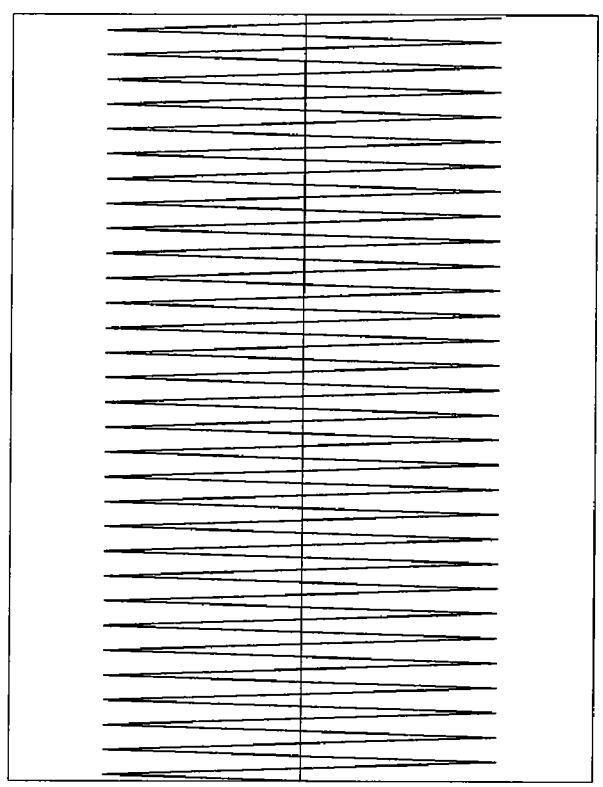

FIG. 4B depicts an example of an un-modulated ionizing source power waveform which is generated by a plasma power source 418 of FIG. 4A. The power is operated at radio frequency (RF). FIG. 4C depicts an example of a square-wave modulated (or pulsed) ionizing source power waveform. The power modulation frequency is typically turned on and off at kHz frequency. The oscillating frequencies (RF) of AC power in FIGS. 4B and 4C are not drawn to scale. The peak RF power is typically set between about 50 watts to about 3000 watts. The duty cycle of the modulations (or pulses) may be between about 5% to about 90% and the ionizing power may be varied between about 0% and about 100% to generate the desired mean temperature of the constituents of the plasma. The plasma nitridation process is typically operated at pressure between about 1 mTorr to about 1 Torr. The nitrogen-containing gas, such as $N_2$ or $NH_3$, flow rate is between about 50 sccm to about 20 slm. In addition to the nitrogen-containing gas, the process gas can include an inert gas, such as He, Ar, Ne (neon), Kr (krypton) or Xe (xenon), to sustain the plasma and to modify the electron temperature. The inert gas flow rate is between about 0 sccm and about 20 slm. An example of a plasma reactor that can be used to perform the process is Decoupled Plasma Nitridation (DPN) chamber made by Applied Materials located in Santa Clara, Calif., as described in FIG. 4A above. However, it is to be noted that the plasma of the plasma nitridation process can be created by various ionizing power sources, which may, for example, include an inductively coupled power source, a capacitatively coupled power source, a surface wave power source, an electronic cyclotron resonance source (ECR source), magnetron or modified magnetron-type sources, or other ionizing sources that may be used to facilitate plasma generation in a processing chamber. A surface wave power source is a very high frequency (100 MHz to 10 GHz) plasma source, in which the gas collision frequency is much less than the electromagnetic wave frequency, such that the electromagnetic power is absorbed into the plasma by a "surface-wave" or "wave-heating" based energy transfer mechanism. Such a source would typically include a very high frequency power source, a wave guide connecting the power source to the chamber, a dielectric chamber wall and an arrangement of openings or slots adjacent to the dielectric wall in which the very high frequency power is coupled in to the chamber. Microwave ionization power source is a type of surface wave power source.

Figure 5B:
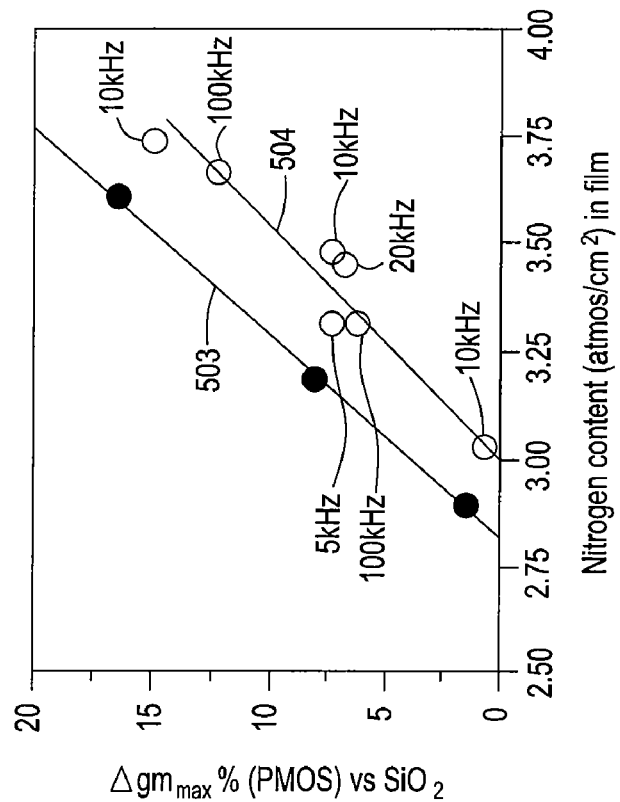
FIGS. 5A and 5B show NMOS (5A) and PMOS (5B) maximum transconductance shifts of the nitrided gate dielectric over un-nitrided gate dielectric as a function of nitrogren content.
Figure 5A:
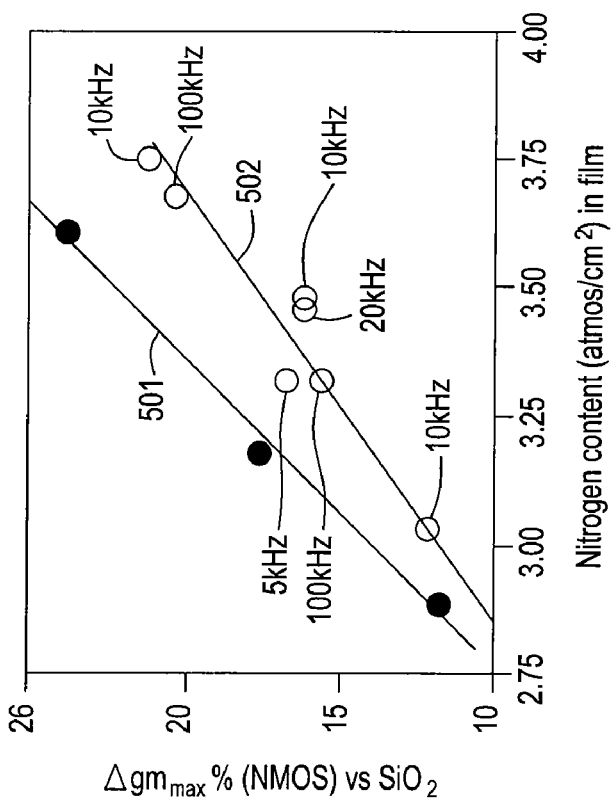

FIG. 5A illustrates data representative of a change in the maximum channel transconductance (gmmax) (versus undoped $SiO_2$) as a function of the percentage of nitrogen in the film for NMOS (n-channel metal oxide semiconductor). It should be noted that in transistor fabrication the lowest possible change or shift transconductance is desired. However, nitrogen is generally introduced into the transistor fabrication process, as it is known to reduce transistor gate leakage, to prevent diffusion of boron from the polysilicon gate electrode, and to reduce the electrical thickness, which provides improved off-state control. Therefore, a higher concentration of nitrogen incorporation is desired. Although the maximum channel transconductance shift (or degradation) may be reduced by eliminating the nitrogen, the elimination of the nitrogen would adversely affect the gate leakage, diffusion, and the off-state control dramatically. As such, the goal is to reduce the maximum channel transconductance shift, while maintaining sufficient nitrogen incorporation and the benefits provided by the nitrogen incorporation.

Specifically, FIG. 5A illustrates the difference in maximum channel transconductance for a nitrogen-containing plasma generated via an un-modulated RF configuration (501) versus a square-wave modulated RF power source (502). Each of the data points for the un-modulated configuration (501) and the square-wave modulated configuration (502) is collected using matching pressures (20 mTorr), powers (500 watts to 750 watts), durations (10 seconds), $N_2$ flow rate (50 sccm to 20 slm), and duty cycles (50%). The data show that the nitrogen-containing plasma utilizing the square-wave modulated power source (open circles and line 502) reduces (or improves) maximum channel transconductance degradation over nitrogen-containing plasmas generated via an un-modulated configuration (filled circles and line 501). Similar improvements in the change in gmmax represented in FIG. 5A have also been obtained for threshold voltage shift and saturation drain current and are described in commonly assigned U.S. patent application Ser. No. 10/461,083, titled "Plasma Method and Apparatus for Processing a Substrate" and filed on Jun. 12, 2003. As illustrated in FIG. 5B, similar improvements (filled circles and line 503 for un-modulated, and open circles and line 504 for square-wave modulated) can be obtained for a PMOS (p-channel metal oxide semiconductor) transistor.

Figure 6:
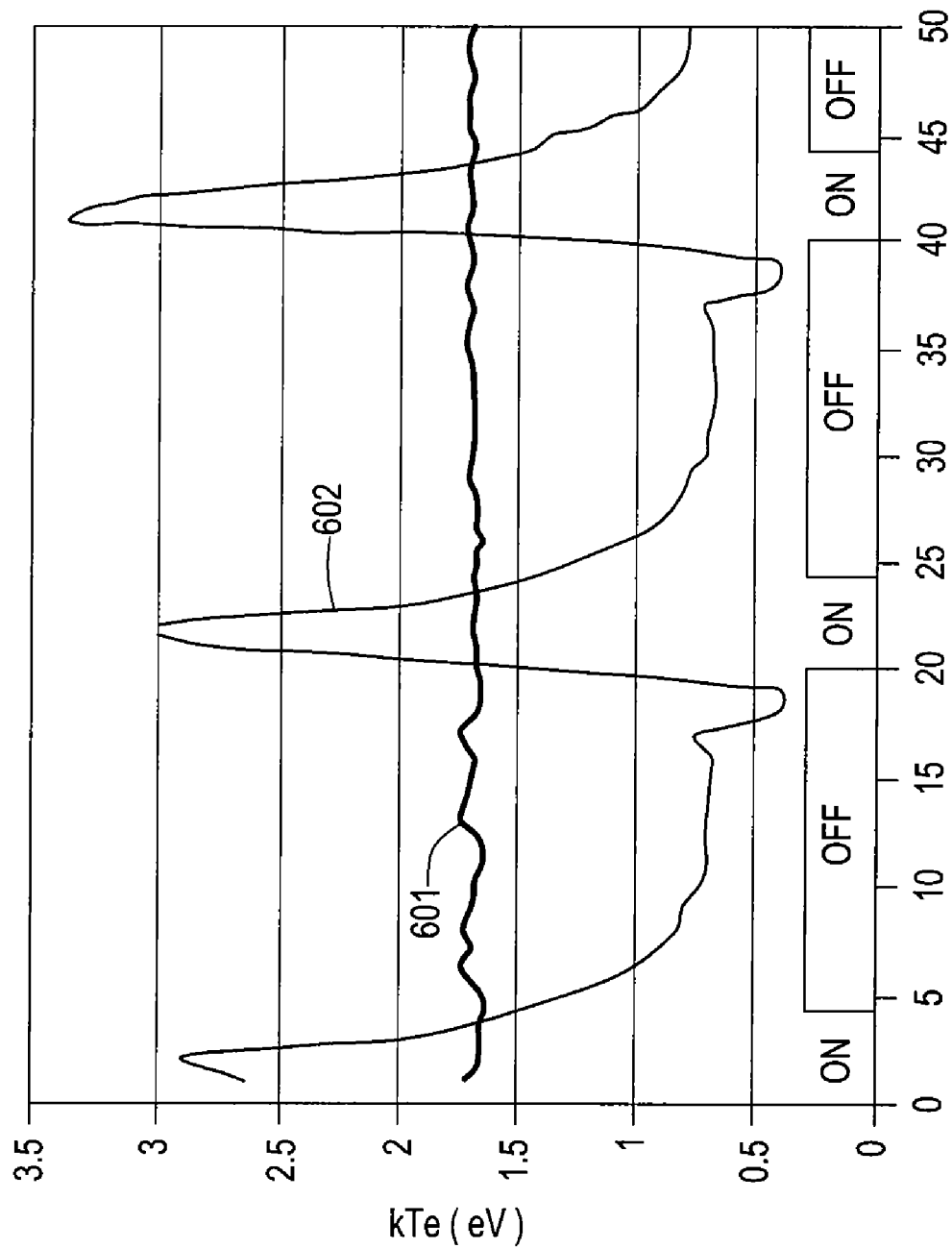
FIG. 6 shows time-resolved electron temperature for un-modulated source power case and square-wave modulated source power case.

Although plasma nitridation by square-wave modulated (or pulsed) source power demonstrated improvements in maximum transconductance degradation, which is a measure of channel mobility, for NMOS and PMOS at a given nitrogen concentration in the gate oxide over un-modulated source power, as depicted in FIGS. 5A and 5B, respectively, the abrupt changes in the source power as a function of time result in short-lived but large magnitude spikes in electron temperature when using square-wave modulation of the source power. A measurement of electron temperature as a function of time for plasma nitridation process with square-wave modulated source power (curve 602) is depicted in FIG. 6. Also plotted for reference in FIG. 6 is electron temperature measured for the un-modulated (curve 601) source power at otherwise identical conditions. The electron temperature measurement is performed using a Langmuir probe in the inductively coupled RF plasma reactor. Langmuir probes allow measurements of the densities and energies of the charged species in the plasma. The probe was positioned at the chamber center and about 4 cm above the wafer. The time constants of the probe collection are long enough to average over both RF-on and RF-off periods of the pulsed RF cases. The time-averaged electron temperature for the square-wave modulated process is less than the un-modulated process, but the square-wave modulated process has significant spikes in electron temperature. The overshoot in electron temperature depicted in FIG. 6 for square-wave modulated source power is due to the abrupt change in the RF power. Electron temperature spikes when the time derivative of the RF power suffers a discontinuity. Since higher electron temperature reflects ions with higher energy, these spikes in electron temperature can be damaging to the channel mobility. At a typical modulating frequency of 10 kHz, the wafer experiences 10,000 such spikes per second. The accumulated damage could be severe.

Figure 7B:
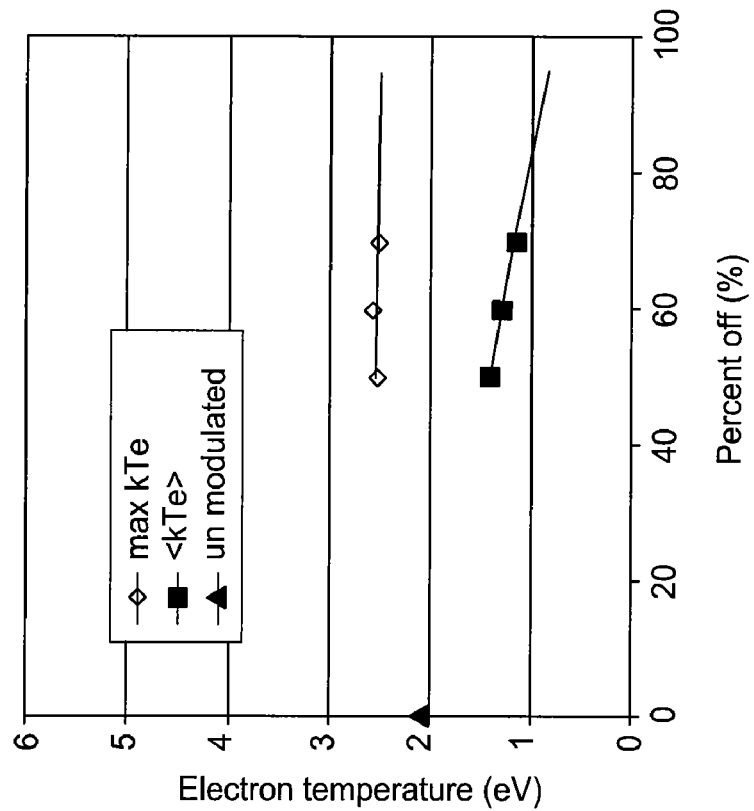
FIGS. 7A and 7B show the maximum electron temperature (Max kTe) and time-averaged electron temperature (<kTe>) for nitrogen plasma as a function of off-time per modulating cycle for square-wave modulated source power (7A) and smooth varying modulated source power (7B).
Figure 7A:
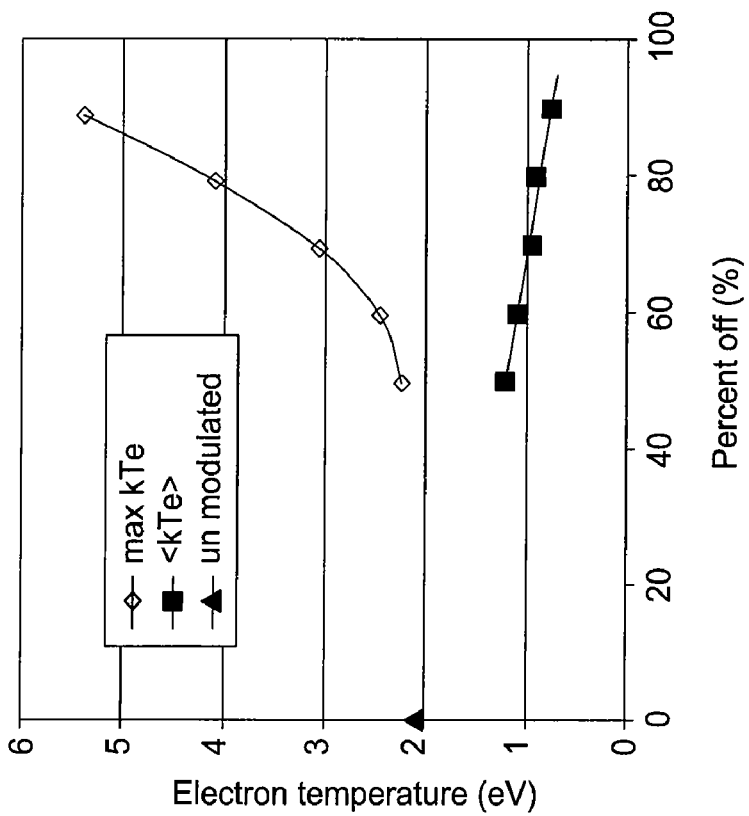

Moreover, FIG. 7A shows the time-averaged electron temperature (<kTe>) desirably decreases with longer off-times (e.g., by decreasing pulsing duty at fixed frequency) when using square-wave modulated source power. Here <kTe> is defined in the usual way in Equation (1) with pulsing period C.

$$\langle kT_e \rangle = \frac{1}{\tau} \int_0^\tau kT_e(t)\,dt \qquad (1)$$

However, as shown in FIG. 7A, the maximum electron temperature spike cannot be diminished for a variety of square-wave modulating parameters. In particular, FIG. 7A indicates that utilizing longer off-times (e.g., by decreasing modulating duty at a fixed frequency) when using square-wave modulated source power results in a larger electron temperature spike (higher Max kTe). The data in FIG. 7A are collected under 10 mTorr chamber pressure, 100 watts effective power, 10 kHz modulation frequency and 10-50% duty cycle. The $N_2$ flow rate is between 50 sccm to 20 slm. Effective power is calculated by multiplying duty cycle by peak power.

An improvement on the squared-wave modulated (or pulsed) source power would be to diminish the electron temperature spikes. The present invention includes a method and an apparatus for diminishing the spike in electron temperature through the use of smooth-varying modulated (or pulsed) source power to improve channel mobility and to reduce transconductance shift degradation.

Figure 8:
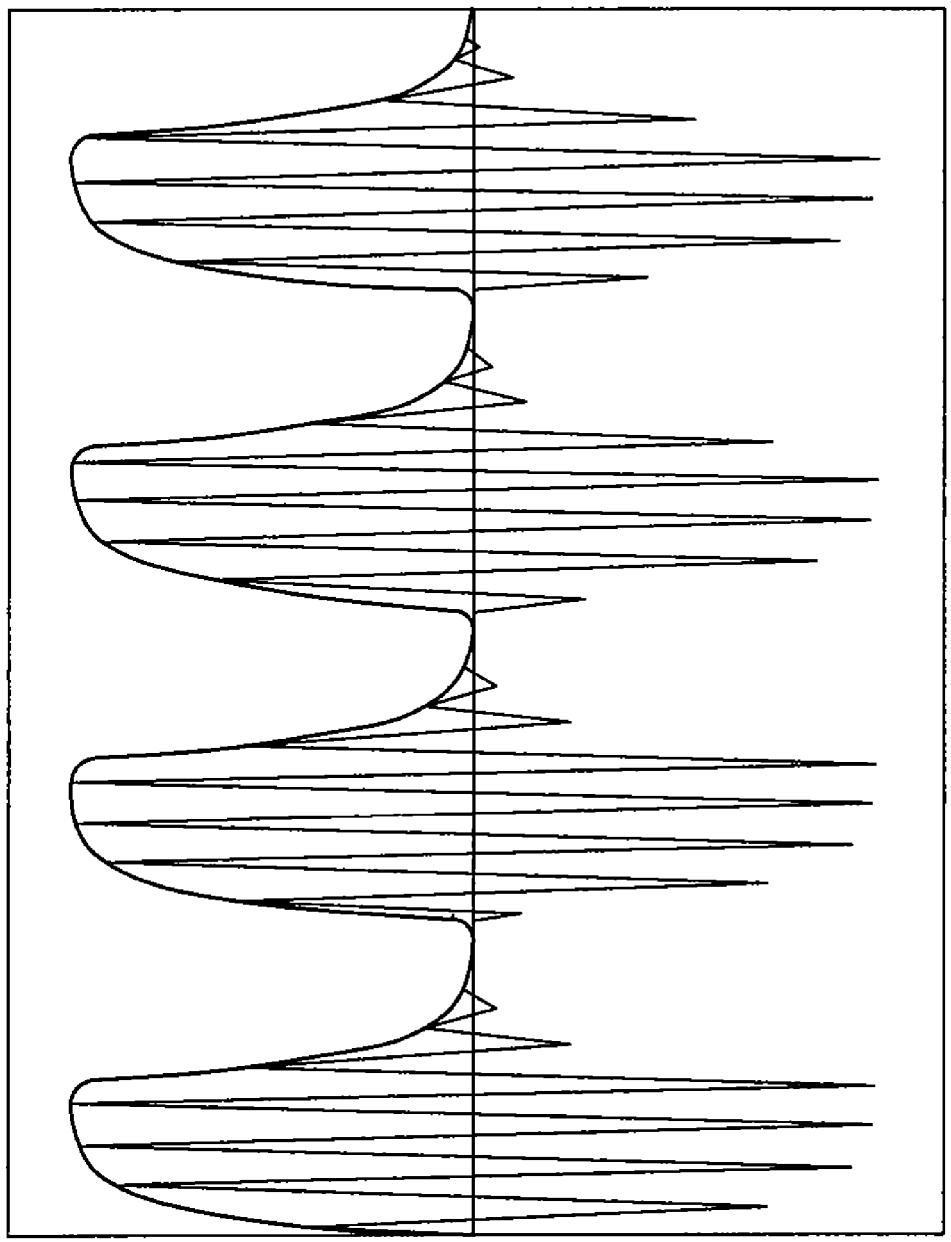
FIG. 8 is a schematic diagram of a smooth-varying modulated RF source power.

Smooth-varying modulated radio-frequency (RF) waveforms like the one depicted in FIG. 8 are used as the ionizing source power to generate nitrogen plasmas. FIG. 7B shows the maximum electron temperature (Max kTe) and the time-averaged electron temperature (<kTe>) collected using the smooth-varying modulated RF waveforms as a function of percent power off time (or 1 minus duty cycle). The results show that in addition to the benefit of low <kTe>, the maximum electron temperature stays flat with longer power off time. The data in FIG. 7A are also collected under similar process conditions as the data in FIG. 7B.

Figure 9B:
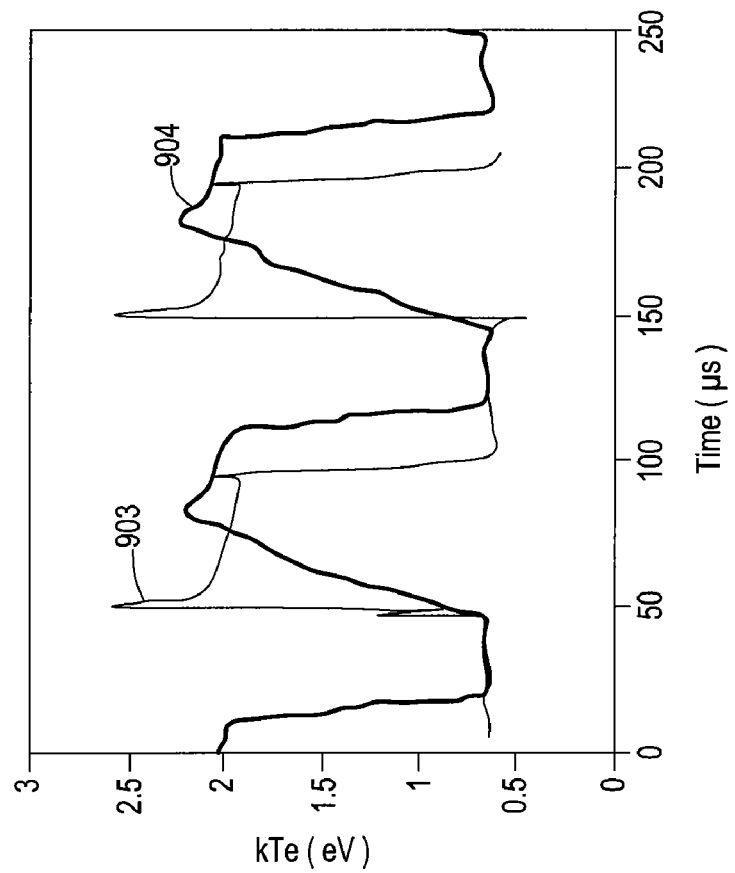
FIGS. 9A and 9B show measurement of time-resolved electron temperature for square-wave modulated and smooth-varying modulated RF nitrogen-containing plasma at 2 kHz (9A) and 10 kHz (9B) pulsing frequency.
Figure 9A:
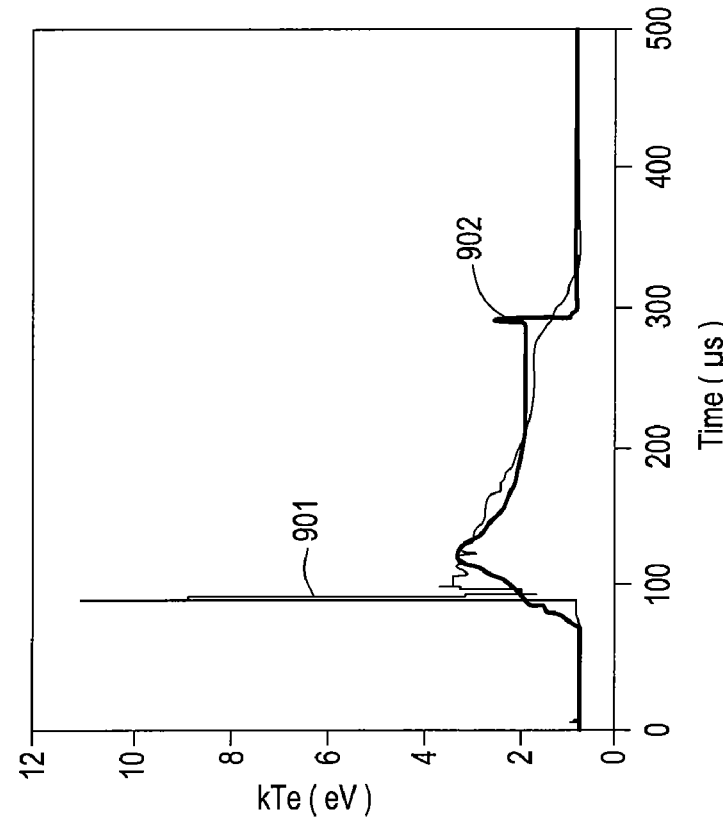

Time-resolved electron temperature measurements of smooth-varying and square-wave modulated RF plasma at 2 kHz pulsing frequency and 50% duty cycle are shown in FIG. 9A. Curve 901 traces the measurements for square-wave modulated RF plasma and shows a large spike when the power is turned on at about 100 μs. Curve 902 traces the measurements for smooth-varying modulated RF plasma and shows a much smaller spike when the power is turned on. The results indicate a smaller maximum kTe for the smooth-varying modulated source power plasma. Similar comparison between square-wave modulated RF plasma and smooth-varying modulated RF plasma at 10 kHz pulsing frequency and 50% duty cycle are shown in FIG. 9B. Curve 903 traces the measurements for square-wave modulated RF plasma, while curve 904 traces the measurements for smooth-varying modulated RF plasma. Results in FIG. 9B also indicate a smaller spike electron temperature spike for smooth-varying modulated RF plasma, compared to square-wave modulated RF plasma. In both cases the overshoot or spike in electron temperature is considerably diminished when comparing the smooth-varying modulated process to the square-wave modulated process. Especially, the invention has demonstrated the capability of controlling the electron temperature overshoot even in the case of relative long power off-times, such as at the 250 μs power off-time in the case of the 2 kHz data shown in curve 902. Achieving long power off-time by both using a lower pulsing frequency or by using lower duty cycle, or both, is desirable to achieve a minimum mean electron temperature (<kTe>). Without the smooth-varying modulation, the maximum electron temperature (Max kTe) is very high for the 2 kHz process (see Curve 901). Smooth-varying modulation enables long off-time to reduce <kTe> without increasing Max kTe.

Figure 10A:
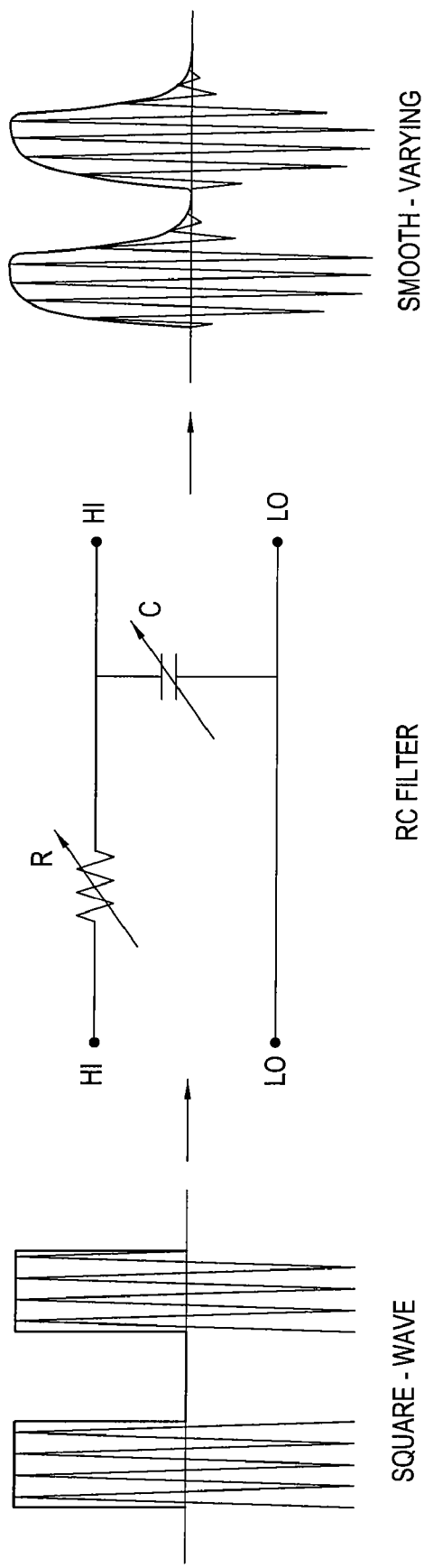
FIG. 10A is a schematic flow diagram of transforming a square-wave modulated RF source power by a RC filter into a smooth-varying modulated RF source power.
Figure 10B:
FIG. 10B is a schematic flow diagram of creation of smooth-varying modulated RF source power.

Smooth-varying modulated power waveforms like the one depicted in FIG. 8 can be generated, in a plasma power source 418 of FIG. 4A, by sending a square-wave modulated RF waveform through a RC (resistor-capacitor) filter, which can attenuate high frequency to smooth out the waveform to become a smooth-varying modulated RF waveform (see FIG. 10A). By adjusting the resistance (R) and capacitance (C) of the filter, smooth varying pulse radio-frequency waveforms can be generated. Smooth-varying modulated RF waveforms can also be generated by a function generator or in combination with a RC filter and/or a broadband amplifier. An example of elements needed to generate a smooth-varying modulated RF power is shown in FIG. 10B. The smooth-varying modulated RF power source, generated by a function generator, a RC filter and a broadband amplifier, is sent to a RF match and a coil. The function generator, RC filter and broadband amplifier are components of plasma power source 418 of FIG. 4A.

It is noted that the smooth-varying modulated waveform shown in FIG. 8 is not the only such waveform which will improve over the un-modulated waveforms or square-wave modulated waveforms. Other general waveform attributes may also offer significant improvements. In general, a lack of discontinuities in the time-derivative of the magnitude of the ionizing source power such that the magnitude of the ionizing power as a function of time is a piecewise smooth may prevent electron temperature spikes. Additionally, a smooth-varying modulated RF waveform with a finite portion where the magnitude of the ionizing power is zero may reduce the time-average value of the electron temperature. Two examples of other types of smooth-varying modulated RF waveforms are shown in FIGS. 11A and 11B. The ramp-up and ramp-down time and slopes in FIGS. 11A and 11B can be equal or be different. The power off time in FIGS. 11A and 11B can be longer or shorter than the power on time.

Figure 13:
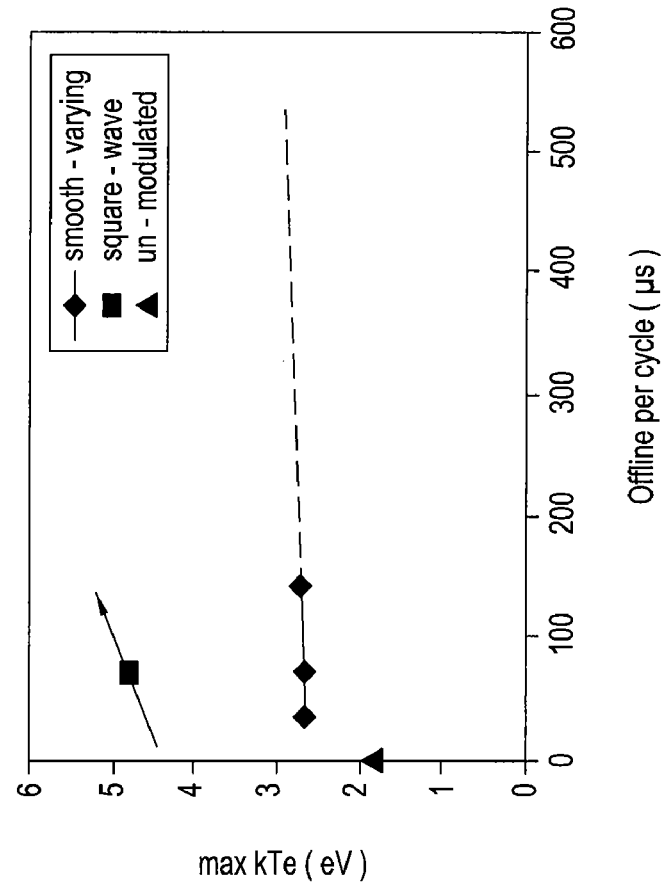
FIG. 13 shows maximum kTe for smooth-varying modulated RF, square-wave modulated RF and un-modulated plasma as a function of off-time per modulation cycle.
Figure 12:
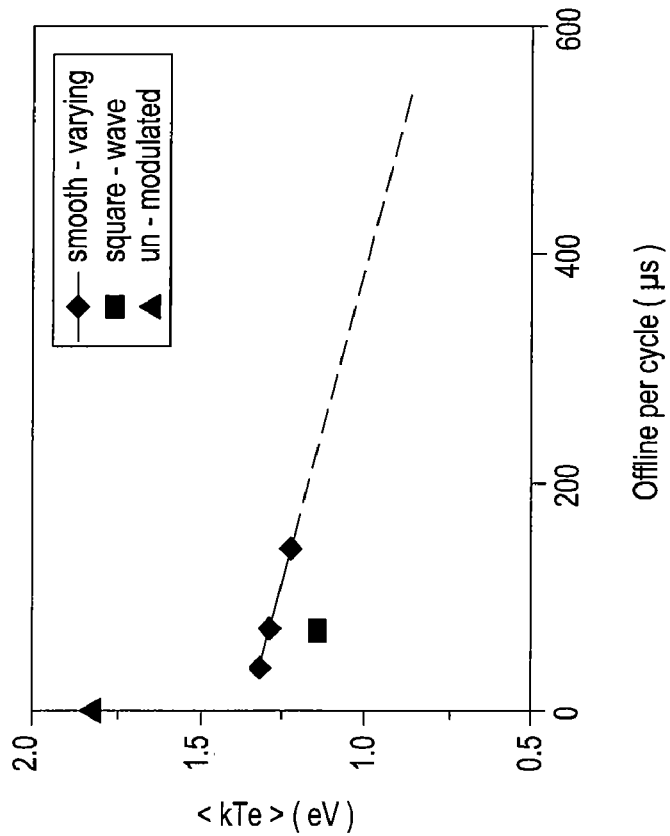
FIG. 12 shows time-averaged kTe (<kTe>) for smooth-varying modulated RF, square-wave modulated RF and un-modulated plasma as a function of off-time per modulation cycle.

FIG. 12 plots time-averaged electron temperature (<kTe>) as a function of off-time per cycle for three cases which are at otherwise identical processing conditions: an un-modulated, a square-wave modulated, and a smooth-varying modulated RF power sources. Both the modulated RF processes have <kTe> less than the un-modulated process. Similar to the results shown in FIG. 7A for square-wave modulated RF process, FIG. 12 also shows that <kTe> is reduced with increasing off-time for smooth-varying modulated RF process. However, FIG. 13 shows that square-wave modulated RF process has approximately two-times greater maximum electron temperature (Max kTe) when compared to smooth-varying modulated RF process. Dashed trend lines are drawn in both FIGS. 12 and 13 for the smooth-varying modulated RF process, indicating a decreasing <kTe> and a roughly constant maximum electron temperature with increasing off-time. Following these trends, improved channel mobility is expected with smooth-varying modulated RF process at longer power off-times.

Figure 14B:
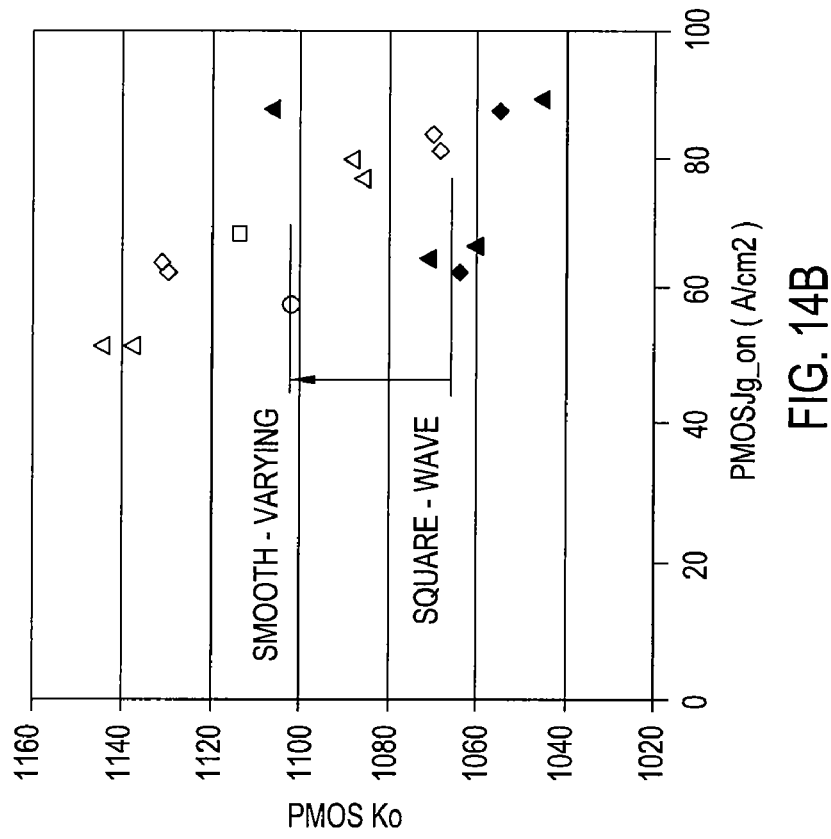
FIGS. 14A and 14B show channel conductivity versus gate leakage flux of un-modulated RF and smooth-varying modulated RF plasma for NMOS (14A) and PMOS (14B).
Figure 14A:
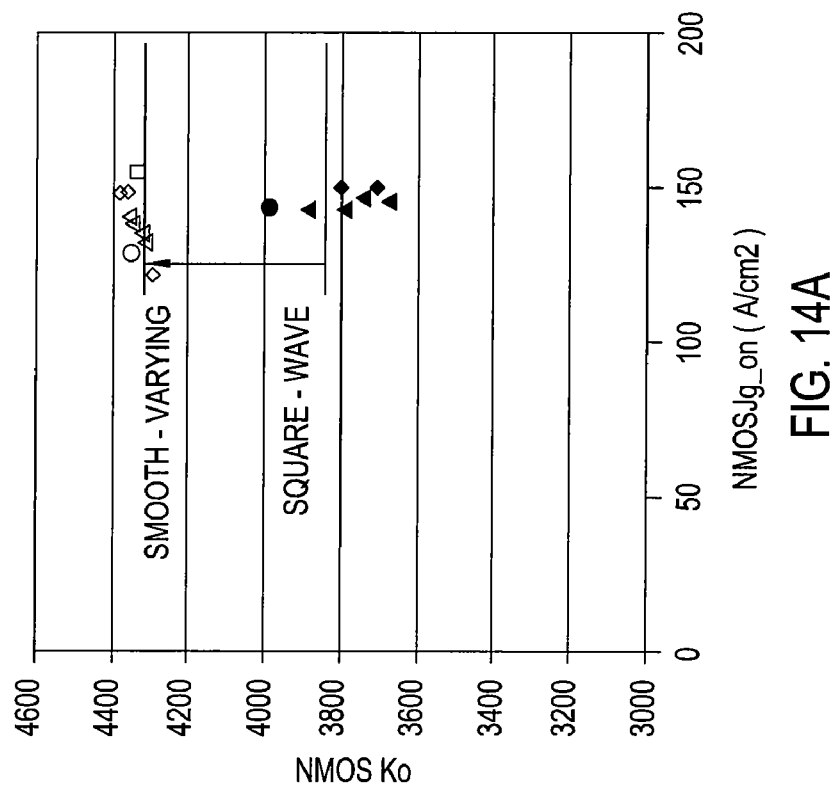

FIGS. 14A and 14B show the data plots of channel conductivity (Ko) versus gate leakage flux (Jg) for NMOS (13A) and PMOS (13B) in the case of dielectrics having fixed EOT (effective oxide thickness) of 1.2 nm. Channel conductivity (Ko) equals to mobility divided by EOT and is a measure of channel mobility. An increase in conductance (Ko) at fixed EOT reflects an increase in mobility. For both NMOS and PMOS, the data show that the smooth-varying modulated RF waveform improves the channel mobility (higher) over the square-wave modulated RF process. For gate leakage flux (Jg), both NMOS and PMOS results show slight improvement (less gate leakage) of the smooth-varying modulated process over square-wave modulated process.

While the foregoing is directed to embodiments of the present invention, other and further embodiments of the invention may be devised without departing from the basic scope thereof, and the scope thereof is determined by the claims that follow.

What is claimed is:

1. A method of plasma nitridation of a gate dielectric, comprising:
    placing a substrate comprising a gate dielectric film in a plasma chamber; and
    exposing the substrate to a nitrogen-containing plasma, ionized by a smooth-varying modulated power source, to form a nitrided gate dielectric on the substrate.

2. The method of claim 1 wherein the gate dielectric is selected from the group consisting of silicon dioxide ($SiO_2$), silicon oxynitride (SiON), silicon nitride (SiN), hafnium oxide ($HfO_2$), hafnium silicate ($HfSiO_2$), hafnium silicon oxynitride (HfSiON), zirconium oxide ($ZrO_2$), Zirconium silicate ($ZrSiO_2$), barium strontium titanate ($BaSrTiO_3$, or BST), and lead zirconate titanate ($Pb(ZrTi)O_3$, or PZT).

3. The method of claim 1 wherein the plasma is provided by applying power to a plasma power source selected from the group consisting of an inductively coupled power source, a capacitatively coupled power source, a surface wave power source, a microwave power source, an electronic cyclotron resonance source (ECR source), and a magnetron or modified magnetron-type sources.

4. The method of claim 1 wherein the smooth-varying modulated power source lacks discontinuities in the time-derivative of the magnitude of the ionizing source power such that the magnitude of the ionizing power as a function of time is piecewise smooth.

5. The method of claim 1 wherein the plasma process is operated at pressure between about 1 mTorr to about 1 Torr.

6. The method of claim 1 wherein the process gas for the nitrogen-containing plasma comprises at least one of nitrogen ($N_2$) and ammonia ($NH_3$) gases at a flow rate between about 50 sccm to about 20 slm.

7. The method of claim 1 wherein the process gas for the nitrogen-containing plasma comprises an inert gas at a flow rate between about 0 slm to about 20 slm.

8. The method of claim 1 wherein the power source is a RF power and the modulation frequency is at about 1 kHz to about 100 kHz.

9. A method of plasma nitridation of a gate dielectric, comprising:
    placing a substrate comprising a gate dielectric film in an inductively coupled plasma chamber; and
    exposing the substrate to a nitrogen-containing plasma, ionized by a smooth-varying modulated power source, to form a nitrided gate dielectric on the substrate, wherein the smooth-varying modulated power source varies a duty cycle of pulses between about 5% and about 90% at a frequency between about 1 kHz to about 100 kHz, and varies an ionizing power between about 0% and about 100% of the peak power, and a process gas for the nitrogen-containing plasma comprises at least one of nitrogen ($N_2$) and ammonia ($NH_3$) gases at a flow rate between about 50 sccm to about 20 slm.

10. The method of claim 9 wherein the smooth-varying modulated power source varies a duty cycle of pulses between about 5% and about 50% at a frequency between about 5 kHz to about 20 kHz.

11. The method of claim 9 wherein the peak power is between about 50 watts to about 3000 watts.

12. A method of plasma nitridation of a gate dielectric, comprising:
    placing a substrate comprising a gate dielectric film in a plasma chamber; and
    exposing the substrate to a nitrogen-containing plasma, ionized by a modulated power source that lacks discontinuities in the time-derivative of the magnitude of the power, to form a nitrided gate dielectric on the substrate.

13. The method of claim 12 wherein the gate dielectric is selected from the group consisting of silicon dioxide ($SiO_2$), silicon oxynitride (SiON), silicon nitride (SiN), hafnium oxide ($HfO_2$), hafnium silicate ($HfSiO_2$), hafnium silicon oxynitride (HfSiON), zirconium oxide ($ZrO_2$), Zirconium silicate ($ZrSiO_2$), barium strontium titanate ($BaSrTiO_3$, or BST), and lead zirconate titanate ($Pb(ZrTi)O_3$, or PZT).

14. The method of claim 12 wherein the plasma is provided by applying power to a plasma power source selected from the group consisting of an inductively coupled power source, a capacitatively coupled power source, a surface wave power source, a microwave power source, an electronic cyclotron resonance source (ECR source), and a magnetron or modified magnetron-type sources.

15. The method of claim 12 wherein the power source is a smooth-varying modulated power source and the time-derivative of the magnitude of the power as a function of time is piecewise smooth.

16. The method of claim 12 wherein the plasma process is operated at pressure between about 1 mTorr to about 1 Torr.

17. The method of claim 12 wherein the process gas for the nitrogen-containing plasma comprises at least one of nitrogen ($N_2$) and ammonia ($NH_3$) gases at a flow rate between about 50 sccm to about 20 slm.

18. The method of claim 12 wherein the process gas for the nitrogen-containing plasma comprises an inert gas at a flow rate between about 0 slm to about 20 slm.

19. The method of claim 12 wherein the power source is a RF power source and the modulation frequency is at about 1 kHz to about 100 kHz.

20. A method of plasma nitridation of a gate dielectric, comprising:
    placing a substrate comprising a gate dielectric film in an inductively coupled plasma chamber; and
    exposing the substrate to a nitrogen-containing plasma, ionized by a modulated power source that lacks discontinuities in the time-derivative of the magnitude of the power, to form a nitrided gate dielectric on the substrate, wherein the modulated power source varies a duty cycle of pulses between about 5% and about 90% at a frequency between about 1 kHz to about 100 kHz, and varies an ionizing power between about 0% and about 100% of peak power, and a process gas for the nitrogen-containing plasma comprises at least one of nitrogen ($N_2$) and ammonia ($NH_3$) gases at a flow rate between about 50 sccm to about 20 slm.

21. The method of claim 20 wherein the power source varies a duty cycle of the pulses between about 5% and about 50% at a frequency between about 5 kHz to about 20 kHz.

22. The method of claim 20 wherein the peak power is between about 50 watts to about 3000 watts.

23. A method of plasma nitridation of a gate dielectric, comprising:
   placing a substrate comprising a gate dielectric film in a plasma chamber; and
   exposing the substrate to a nitrogen-containing plasma, ionized by a square-wave modulated RF waveform that is filtered by a resistor-capacitor to become a smooth-varying modulated RF waveform power source, to form a nitrided gate dielectric on the substrate.

24. The method of claim 23 wherein the gate dielectric is selected from the group including silicon dioxide ($SiO_2$), silicon oxynitride (SiON), silicon nitride (SiN), hafnium oxide ($HfO_2$), hafnium silicate ($HfSiO_2$), hafnium silicon oxynitride (HfSiON), zirconium oxide ($ZrO_2$), Zirconium silicate ($ZrSiO_2$), barium strontium titanate ($BaSrTiO_3$, or BST), and lead zirconate titanate ($Pb(ZrTi)O_3$, or PZT).

25. The method of claim 23 wherein the plasma is provided by applying power to a plasma power source selected from the group consisting of an inductively coupled power source, a capacitatively coupled power source, a surface wave power source, a microwave power source, an electronic cyclotron resonance source (ECR source), and a magnetron or modified magnetron-type sources.

26. The method of claim 23 wherein the power source lacks discontinuities in the time-derivative of the magnitude of the power and the magnitude of the ionizing power as a function of time is piecewise smooth.

27. The method of claim 23 wherein the plasma process is operated at pressure between about 1 mTorr to about 1 Torr.

28. The method of claim 23 wherein the process gas for the nitrogen-containing plasma comprises at least one of nitrogen ($N_2$) and ammonia ($NH_3$) gases at a flow rate between about 50 sccm to about 20 slm.

29. The method of claim 23 wherein the process gas for the nitrogen-containing plasma comprises an inert gas at a flow rate between about 0 sccm to about 20 slm.

30. The method of claim 23 wherein the power source is a RF power source and the modulation frequency is at about 1 kHz to about 100 kHz.

31. A method of plasma nitridation of a gate dielectric, comprising:
   placing a substrate comprising a gate dielectric film in an inductively coupled plasma chamber; and
   exposing the substrate to a nitrogen-containing plasma, ionized by a square-wave modulated RF waveform that is filtered by a resistor-capacitor to become a smooth-varying modulated RF waveform power source, to form a nitrided gate dielectric on the substrate, wherein the power source varies a duty cycle of pulses between about 5% and about 90% at a frequency between about 1 kHz to about 100 kHz, and varies an ionizing power between about 0% and about 100% of peak power, and a process gas for the nitrogen-containing plasma comprises at least one of nitrogen ($N_2$) and ammonia ($NH_3$) gases at a flow rate between about 50 sccm to about 20 slm.

32. The method of claim 31 wherein the power source varies a duty cycle of the pulses between about 5% and about 50% at a frequency between about 5 kHz to about 20 kHz.

33. The method of claim 31 wherein the peak power is between about 50 watts to about 3000 watts.

* * * * *

UNITED STATES PATENT AND TRADEMARK OFFICE
CERTIFICATE OF CORRECTION

PATENT NO. : 7,514,373 B2  Page 1 of 1
APPLICATION NO. : 11/421163
DATED : April 7, 2009
INVENTOR(S) : Kraus et al.

It is certified that error appears in the above-identified patent and that said Letters Patent is hereby corrected as shown below:

Column 9, Line 16, please delete "C" and insert --τ-- therefor.

Signed and Sealed this

Ninth Day of June, 2009

JOHN DOLL
*Acting Director of the United States Patent and Trademark Office*